(12) United States Patent
Rocher et al.

(10) Patent No.: US 12,346,287 B2
(45) Date of Patent: Jul. 1, 2025

(54) DEVICE FOR AUTOMATICALLY DETECTING COUPLING BETWEEN ELECTRONIC DEVICES

(71) Applicant: Vitesco Technologies GmbH, Regensburg (DE)

(72) Inventors: Jacques Rocher, Toulouse (FR); Yannick Leroy, Toulouse (FR)

(73) Assignee: Vitesco Technologies GmbH, Regensburg (DE)

( * ) Notice: Subject to any disclaimer, the term of this patent is extended or adjusted under 35 U.S.C. 154(b) by 248 days.

(21) Appl. No.: 18/014,896

(22) PCT Filed: Jul. 12, 2021

(86) PCT No.: PCT/EP2021/069261
§ 371 (c)(1),
(2) Date: Jan. 6, 2023

(87) PCT Pub. No.: WO2022/017840
PCT Pub. Date: Jan. 27, 2022

(65) Prior Publication Data
US 2023/0251991 A1    Aug. 10, 2023

(51) Int. Cl.
G06F 15/177    (2006.01)
G01R 31/00    (2006.01)

(52) U.S. Cl.
CPC ......... *G06F 15/177* (2013.01); *G01R 31/007* (2013.01)

(58) Field of Classification Search
CPC .................................................. G01R 31/007
See application file for complete search history.

(56) References Cited

U.S. PATENT DOCUMENTS

| | | | |
|---|---|---|---|
| 2003/0234686 A1* | 12/2003 | Kang | H03F 1/56 330/86 |
| 2009/0128099 A1* | 5/2009 | Minkkinen | H02J 9/005 710/17 |
| 2012/0139615 A1 | 6/2012 | Zimmermann | |
| 2014/0223037 A1* | 8/2014 | Minoo | G06F 11/3051 710/16 |

(Continued)

FOREIGN PATENT DOCUMENTS

| FR | 3090888 A1 | 6/2020 |
|---|---|---|
| FR | 3090925 A1 | 6/2020 |

OTHER PUBLICATIONS

Translation of PCTEP2021069261 (Year: 2021).*

(Continued)

*Primary Examiner* — Paresh Patel
(74) *Attorney, Agent, or Firm* — Buchanan Ingersoll & Rooney PC

(57) ABSTRACT

A method for automatically detecting a sensor coupled to an electronic computer, including a second step, consisting of passing to a third step when the electronic computer is activated, the third step, consisting of comparing a voltage generated by the sensor coupled to the terminals of the electronic computer with a reference voltage, in the event that the result of the comparison is positive, then passing to a fourth step, and in the event that the result of the comparison is negative, passing to a fifth step, the fourth step, consisting of selecting an impedance matched to the coupling of the voltage-source sensor to the terminals of the electronic computer.

6 Claims, 3 Drawing Sheets

(56) References Cited

U.S. PATENT DOCUMENTS

| | | | |
|---|---|---|---|
| 2020/0050146 A1* | 2/2020 | Kim | G02B 27/0938 |
| 2022/0050146 A1 | 2/2022 | Leroy et al. | |
| 2023/0228801 A1* | 7/2023 | Rocher | G01R 31/006 |
| | | | 702/58 |
| 2023/0242087 A1* | 8/2023 | Rocher | B60W 10/06 |
| | | | 701/53 |
| 2023/0289426 A1* | 9/2023 | Rocher | G06F 15/177 |

OTHER PUBLICATIONS

International Search Report and Written Opinion for International Application No. PCT/EP2021/069261, mailed Oct. 26, 2021, 8 pages.

International Search Report and Written Opinion for International Application No. PCT/EP2021/069261, mailed Oct. 26, 2021, 11 pages (French).

* cited by examiner

DEVICE FOR AUTOMATICALLY DETECTING COUPLING BETWEEN ELECTRONIC DEVICES

CROSS REFERENCE TO RELATED APPLICATIONS

This application is the U.S. National Phase Application of PCT International Application No. PCT/EP2021/069261, filed Jul. 12, 2021, which claims priority to French Patent Application No. 2007641, filed Jul. 21, 2020, the contents of such applications being incorporated by reference herein.

FIELD OF THE INVENTION

The present invention relates generally to the coupling of electronic devices. The invention finds applications, in particular, in the automotive field. It may be implemented, for example, in an electronic computer.

BACKGROUND OF THE INVENTION

A motor vehicle nowadays comprises more and more onboard electronics such as, for example, sensors coupled to electronic computers. These onboard electronics require connection technology of greater or lesser complexity in the motor vehicle.

In the case of an internal combustion engine, sensors are used and coupled to at least one electronic computer such as an engine control computer in order to ensure the correct functioning of said internal combustion engine and thus allow better control of fuel consumption and therefore control of the emission of pollutants into the atmosphere.

To produce these sensors, it is known practice in the prior art to use a voltage-source sensor positioned facing a movable notched target. Said sensor generally has three sensor pins for transferring a detection signal in the form of a variation in voltage to the engine control computer.

For a few years, a new sensor technology has been developed: current-source sensors. These sensors deliver information in the form of a variation in current.

Depending on the type of sensor used, there is, at the level of the engine control computer, a different dedicated hardware interface allowing the coupling of said sensor to said engine control computer. This interface makes it possible, among other things, with suitable electronics (in the electronic computer) to generate and receive electrical signals appropriate for managing, in this case, the internal combustion engine.

Thus, it is necessary, when designing the engine control computer, to modify its hardware interface depending on the type of sensor connected, that is to say a voltage-source sensor or a current-source sensor. Consequently, it is no longer possible, once the choice of sensor has been made, to change the type of sensor, for example over the lifespan of the vehicle, because the hardware interface is not adaptive.

SUMMARY OF THE INVENTION

An aspect of the invention proposes a method for automatically detecting a sensor coupled to an electronic computer, comprising:
 a second step e2), consisting of passing to a third step e3) when the electronic computer is activated,
 the third step e3), consisting of comparing a voltage generated by the sensor coupled to the terminals of the electronic computer with a reference voltage (Vref), in the event that the result of the comparison is positive, then passing to a fourth step e4), and in the event that the result of the comparison is negative, passing to a fifth step e5),
 the fourth step e4), consisting of selecting an impedance matched to the coupling of the voltage-source sensor to the terminals of the electronic computer (4),
 the fifth step e5), consisting of selecting an impedance matched to the coupling of the current-source sensor to the terminals of the electronic computer.

Advantageously, it is possible to select an impedance on the pins of the electronic computer that is compatible with the type of sensor connected.

For example, the method according to an aspect of the invention makes provision for the reference voltage to have a value comprised between a value corresponding to a high level of the voltage sensor and a value corresponding to a high level of the current sensor.

For example, the automatic detection method makes provision for the impedance matched to the coupling of the voltage-source sensor to the terminals of the electronic computer to have a value of greater than 1000Ω.

As a variant, the method for automatically detecting a sensor coupled to an electronic computer proposes that the impedance matched to the coupling of the current-source sensor to the terminals of the electronic computer has a value of greater than 10Ω.

BRIEF DESCRIPTION OF THE DRAWINGS

One preferred exemplary embodiment of the invention will now be described with reference to the appended drawings, in which.

DETAILED DESCRIPTION OF THE PREFERRED EMBODIMENTS

Figure 1:
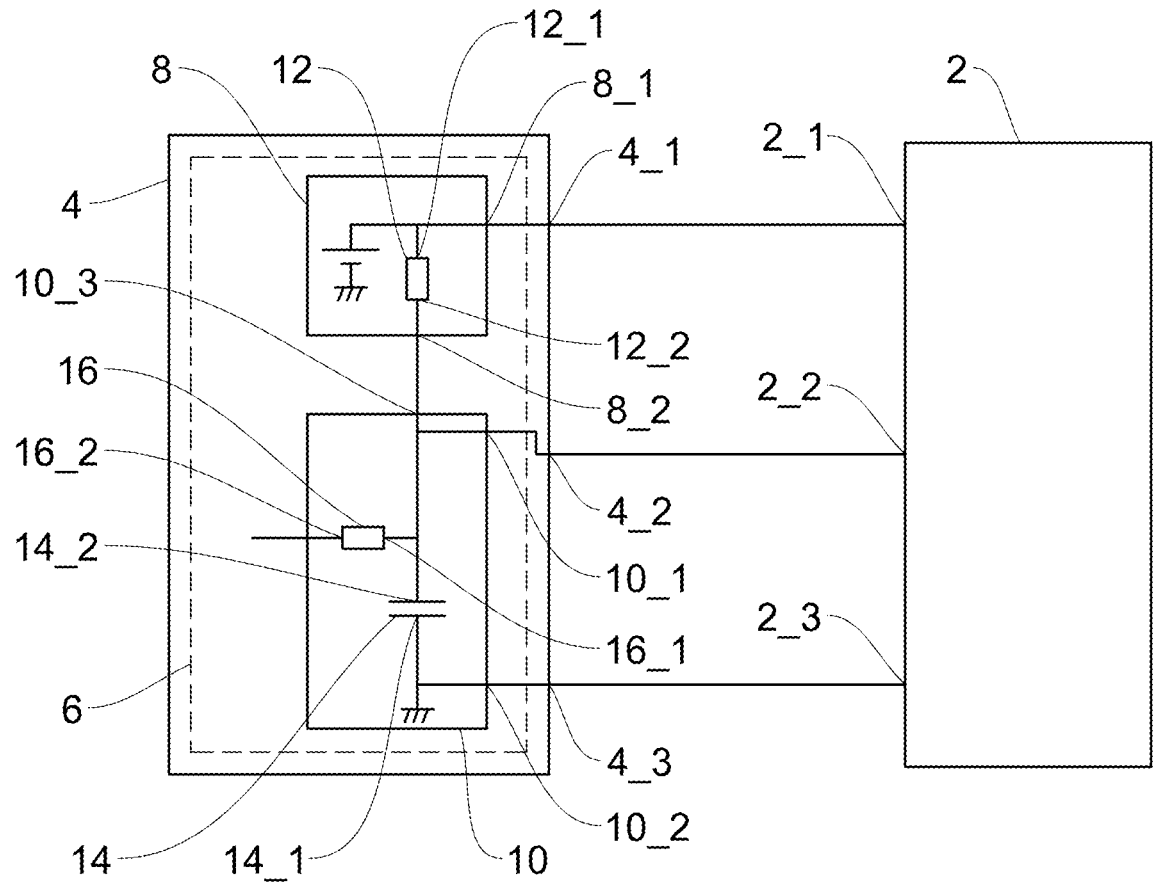
FIG. 1 shows a schematic view of a computer of the prior art coupled to a voltage-source sensor.

FIG. 1 illustrates a voltage-source sensor 2 of the prior art coupled, for example, to an engine control computer 4. The voltage-source sensor 2 is, for example, a sensor dedicated to detecting the positioning of a camshaft of an internal combustion engine through the movement of teeth of said target in front of said voltage-source sensor 2. Such a voltage-source sensor 2 generally comprises three pins with a first sensor pin 2_1 coupled, for example, to a first computer pin 4_1 and suitable for supplying said voltage-source sensor 2 with electrical power; a second sensor pin 2_2 coupled to a second computer pin 4_2 dedicated to receiving a signal which is representative of the position of the camshaft; and finally a third sensor pin 2_3 coupled to a third computer pin 4_3 which is generally coupled to an electrical ground of the motor vehicle. The internal structure of the voltage-source sensor 2 is well known to those skilled in the art; it will not be presented in detail here.

The engine control computer 4 has a hardware interface 6 comprising, for example, a sensor power-supply module 8 and a signal processing module 10.

The sensor power-supply module 8 is suitable for supplying electrical power to the voltage-source sensor 2. To do this, it has a first sensor power-supply module pin 8_1 suitable for generating said electrical power supply for said voltage-source sensor 2 through the first computer pin 4_1. For example, the electrical power supply has a value of 5 V. The internal structure of the sensor power-supply module 8 is well known to those skilled in the art and numerous variants are available to them.

In one exemplary embodiment, the sensor power-supply module 8 comprises an electrical power supply, which may be a power supply that is internal to the engine control computer 4, and a so-called "pull-up" resistor 12. Said pull-up resistor 12 has the role of biasing the voltage-source sensor 2. The pull-up resistor 12 comprises a first resistor pin 12_1 coupled, on the one hand, to the electric power supply and, on the other hand, to the first sensor power-supply module pin 8_1. It further comprises a second resistor pin 12_2 coupled to a second electric-power-supply module pin 8_2.

The signal processing module 10 is suitable for shaping and/or filtering a signal originating from the voltage-source sensor 2. To do this, the signal processing module 10 comprises a first signal processing module pin 10_1, a second signal processing module pin 10_2 and a third signal processing module pin 10_3.

For example, the first signal processing module pin 10_1 is coupled to the second computer pin 4_2 and also to the third signal processing module pin 10_3. The second signal processing module pin 10_2 is coupled to the third computer pin 4_3 and the third signal processing module pin 10_3 is coupled to the second electric-power-supply module pin 8_2. A fourth signal processing module pin 10_4 is suitable for generating a filtered signal for at least one other function of the engine control computer 4.

Furthermore, the internal structure of the signal processing module 10 may comprise a first capacitor 14 having a first first capacitor pin 14_1 and a second first capacitor pin 14_2. The second first capacitor pin 14_2 is coupled to electrical ground and the first first capacitor pin 14_1 is coupled, on the one hand, to a first resistor pin 16_1 and, on the other hand, to the third signal processing module pin 10_3. Furthermore, the third pin 10_3 is coupled to the first pin 10_1. The signal processing module 10 further has a resistor 16 having a second resistor pin 16_2. The second resistor pin 16_2 is coupled to the fourth signal processing module pin 10_4. The values of the various elements, such as the resistors and the capacitor, are well known to those skilled in the art and are consequently not given here.

Figure 2:
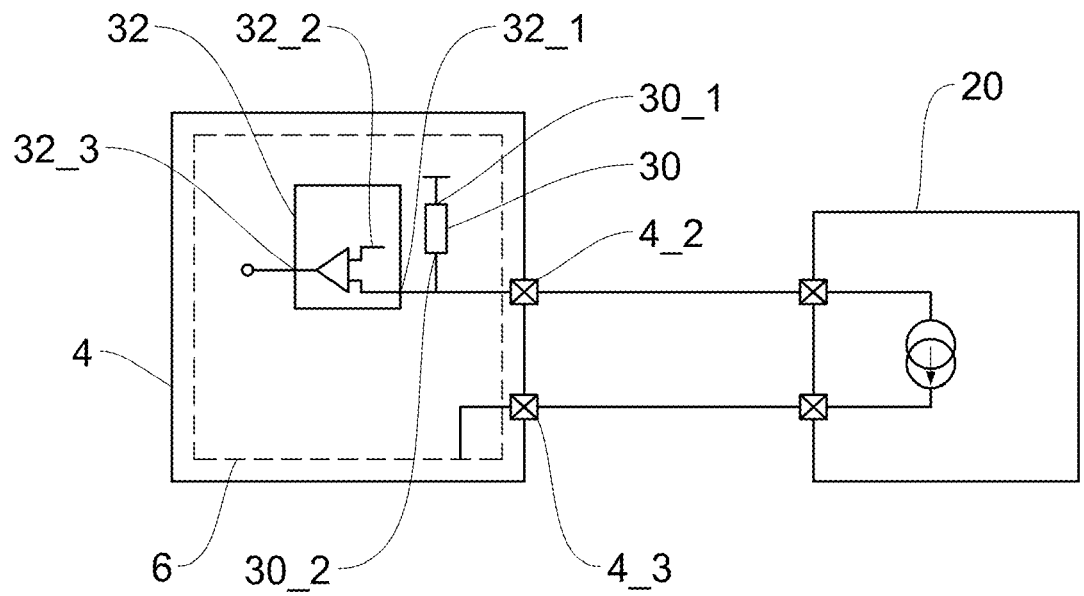
FIG. 2 shows a schematic view of a computer of the prior art coupled to a current-source sensor.

FIG. 2 presents an example of a current-source sensor 20 of the prior art. This current-source sensor 20 operates and is coupled to the engine control computer 4. The current-source sensor 20 delivers information in the form of a current variation requiring a different hardware interface 6 at the level of the engine control computer 4 in order to be able to detect close current levels originating from the current-source sensor 20.

To do this, use may be made of a resistor 30 known by those skilled in the art as a shunt resistor comprising a first resistor pin 30_1 and a second resistor pin 30_2. The first resistor pin 30_1 is coupled to the electrical power supply of said engine control computer 4, the second resistor pin 30_2 is coupled, on the one hand, to the second computer pin 4_2 and, on the other hand, to a first conversion device pin 32_1.

The conversion device 32 is suitable for comparing and matching the voltage applied to the second resistor pin 30_2 and the reference voltage applied to the second conversion device pin 32_2.

The conversion device 32 is in one exemplary embodiment a comparator assembly made using an operational amplifier. The conversion device 32 further has a second conversion device pin 32_2 coupled to a reference voltage. The value of the reference voltage may, for example, be 4.5 V. Furthermore, the conversion device 32 has a third conversion device pin 32_3 coupled to internal functions of the engine control computer 4. The latter is therefore suitable for generating an electrical signal in the form of at least two voltage levels which are representative of the current flowing through the shunt resistor 30. Preferably, the shunt resistor 30 has a relatively low value of the order of 10 ohms, for example.

As mentioned above in the text of the description, for each type of sensor 2 or 20, it is therefore necessary to modify the internal structure of the hardware interface 6 upstream.

Figure 3:
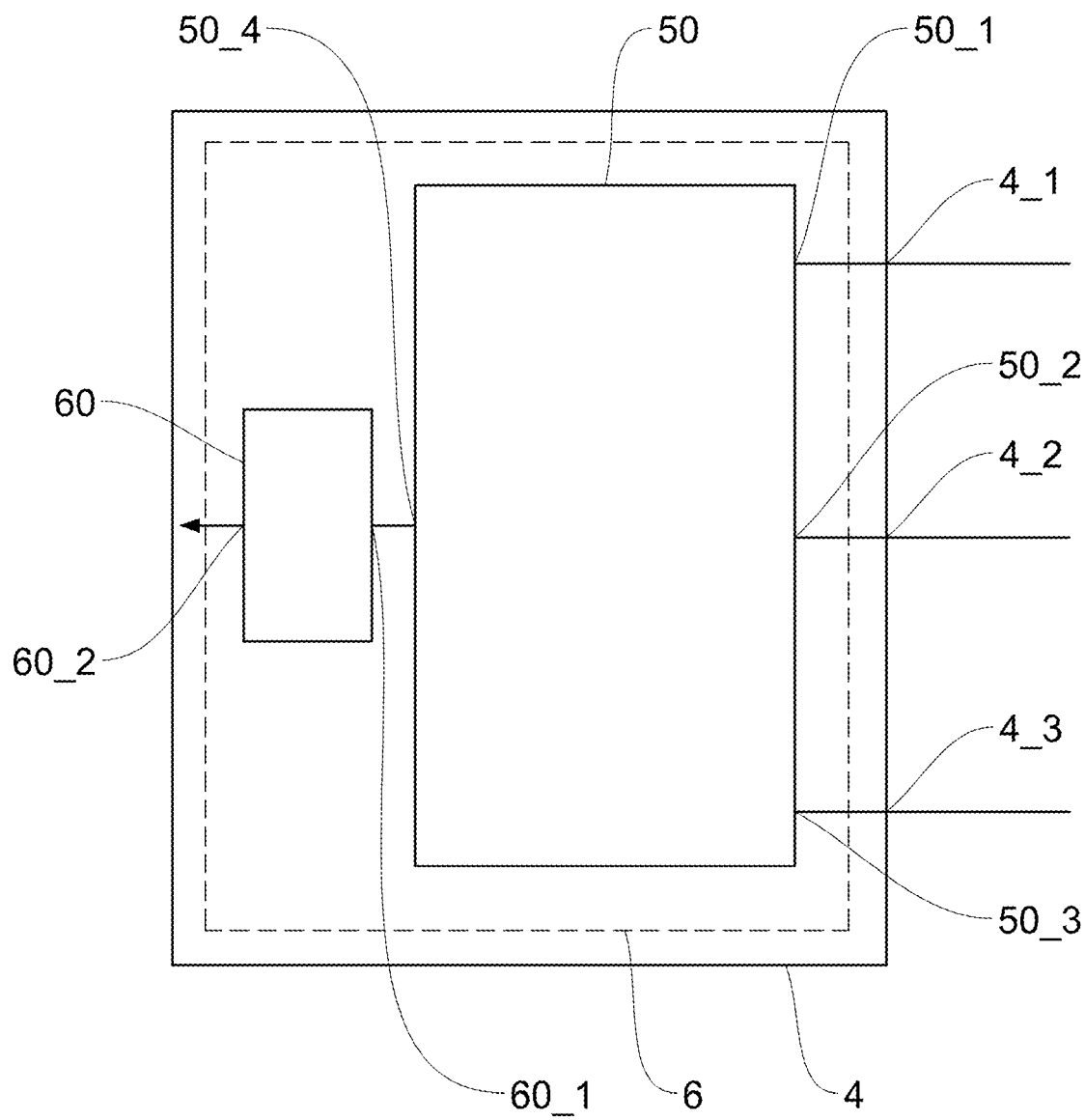
FIG. 3 shows a schematic view of a computer comprising a hardware interface according to an aspect of the invention.

FIG. 3 shows a hardware interface 6 allowing the coupling of either a voltage-source sensor or a current-source sensor without modifying the internal structure of the hardware interface 6 upstream.

To do this, the hardware interface 6 comprises a matching module 50 and a processing module 60 making it possible to connect either a voltage-source sensor 2 or a voltage-source sensor 20 to the engine control computer 4 without modifying the internal interface of said engine control computer 4.

The matching module 50 has, in one embodiment of the invention, a first matching module pin 50_1, a second matching module pin 50_2 and a third matching module pin 50_3 which are coupled, respectively, to the first computer pin 4_1, to the second computer pin 4_2 and to the third computer pin 4_3. The matching module 50 further has at least a fourth matching module pin 50_4.

The first sensor detection module pin 50_1, the second sensor detection module pin 50_2 and the third sensor detection module pin 50_3 are suitable for receiving signals originating from a sensor 2, 20 coupled to said pins.

Thus, for example, when the sensor 2, 20 coupled to the engine control computer 4 is a voltage-source sensor 2, the matching module 50 then selects, from among the pins of said computer 4 (coupled to the sensor 2), a resistor with a high impedance of the order of 1000 ohms. The equivalent electronic circuit in this embodiment is then the circuit shown in FIG. 1. The operation of the matching module 50 in this embodiment is also similar to that of the electronic circuit of FIG. 1 presented above.

In the event that the sensor 20 is a current-source sensor, the matching module 50 then selects, from among the pins of said computer 4 (coupled to the sensor 20), a resistor with a relatively low impedance of the order of 10 ohms. For example, the equivalent electronic circuit in this embodiment is the circuit shown in FIG. 2; the operation is also identical to that of FIG. 2.

Figure 4:
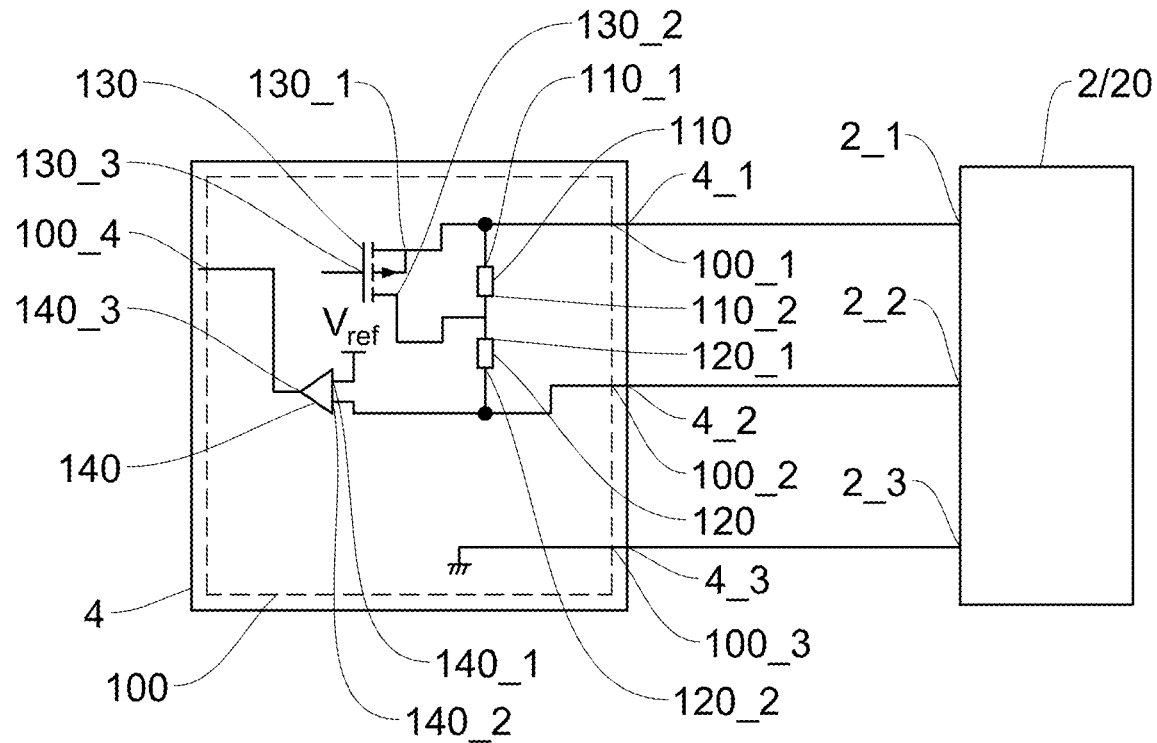
FIG. 4 is a device for automatically detecting a sensor coupled to the computer according to an aspect of the invention.

FIG. 4 presents an exemplary embodiment of the matching module 50 and of the processing module 60 which are brought together in a hardware interface 100 allowing the coupling either of a voltage-source sensor 2 or of a current-source sensor 20 without modifying the internal structure of the hardware interface 100 upstream.

To do this, ingeniously, what is proposed is a hardware interface 100 which is suitable for connecting either a voltage-source sensor 2 or a current-source sensor 20 to the engine control computer 4 without any need to modify the hardware interface 100 of said engine control computer 4. Thus, advantageously, the hardware interface 100 is compatible with the two types of sensors 2, 20.

The hardware interface 100 comprises, in one preferred embodiment, a first hardware interface input 100_1, a second hardware interface input 100_2 and a third hardware interface input 100_3 which are coupled, respectively, to the first computer pin 4_1, to the second computer pin 4_2 and to the third computer pin 4_3. The hardware interface 100 further comprises a first hardware interface output 100_4 coupled to devices that are internal and/or external to the engine control computer 4.

The hardware interface 100 comprises a first resistor 110, a second resistor 120, a transistor 130, and a comparator 140.

The first resistor 110 comprises a first first resistor pin 110_1 and a second first resistor pin 110_2. The second resistor 120 comprises a first second resistor pin 120_1 and a second second resistor 120 pin 120_2. The first first resistor pin 110_1 is coupled, on the one hand, to the first hardware interface pin 100_1 and, on the other hand, to a first transistor pin 130_1. The second first resistor pin 110_2 is coupled, on the one hand, to the first second resistor pin 120_1 and, on the other hand, to a second transistor pin 130_2. Furthermore, the transistor 130 comprises a third transistor pin 130_3 corresponding, in the case of an MOS (metal-oxide-semiconductor) transistor 130, to the gate, as known by those skilled in the art.

The second second resistor pin 120_2 is coupled, on the one hand, to the second hardware interface pin 100_2 and, on the other hand, to a second comparator input 140_2. The comparator 140 further comprises a first input 140_1 coupled to a reference voltage which may have, in one exemplary embodiment, a value of 4.8 V. The first comparator output 140_3 is coupled to the first hardware interface output 100_4. The third hardware interface input 100_3 is coupled to a ground of the motor vehicle.

Advantageously, by virtue of the hardware interface 100 according to an aspect of the invention and more precisely by virtue of the combination of the coupling of the first resistor 110, of the second resistor 120, of the transistor 130 and of the comparator 40, it is possible to select a low impedance value corresponding to the value of the second resistor 120 or a high impedance value corresponding to the value of the first resistor 110 added to the value of the second resistor 120 between the first hardware interface pin 100_1 and the second hardware interface pin 100_2 further allowing compatibility with a current-source or voltage-source sensor.

In a variant of an embodiment, the comparator 140 and the associated connection technology may be coupled directly to the transistor 130 in order to control said transistor 130 and thus control the appropriate impedance at the terminals of the electronic computer 4 depending on the sensor 2, 20 coupled.

Figure 5:
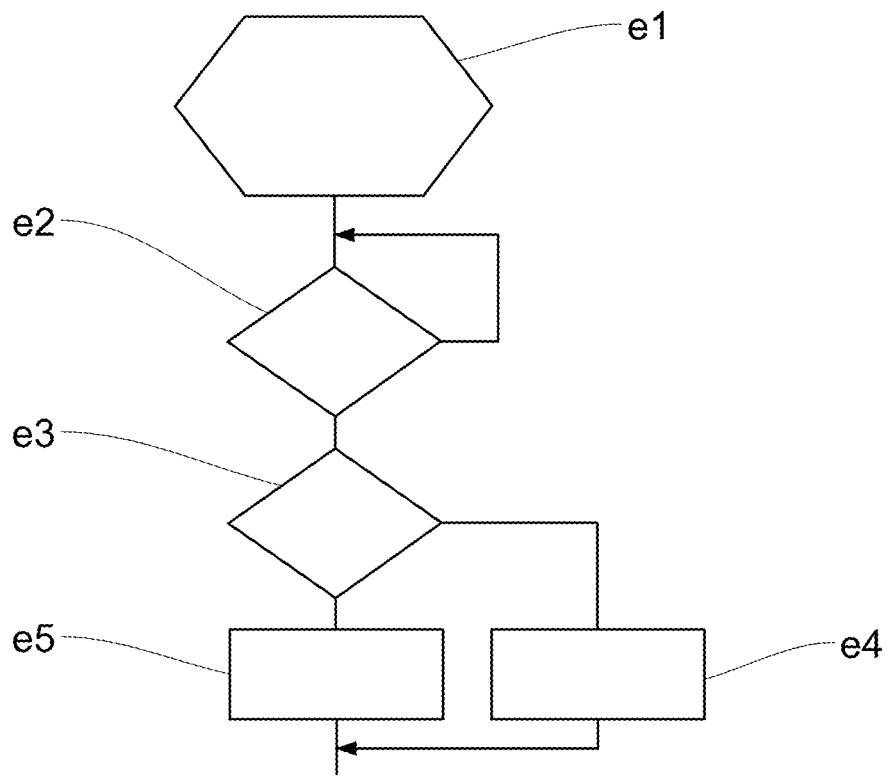
FIG. 5 is the method for automatically detecting a sensor coupled to the computer according to an aspect of the invention.

An aspect if the invention proposes a method for selecting the appropriate impedance depending on the sensor 2, 20 coupled, as illustrated in FIG. 5.

The method according to an aspect of the invention has a first step e1) consisting in that the electronic computer 4 is switched off, corresponding for example to the state of a stationary vehicle.

The method then makes provision for a second step e2) consisting of passing to a third step e3) when the electronic computer 4 is activated, that is to say powered up.

During the third step e3), the method compares the voltage generated by the sensor 2, 20 coupled to the terminals of the electronic computer 4 with a reference voltage Vref. Advantageously, the reference voltage Vref of the comparator 140 has a value of 4.8 V. This value makes it possible to discriminate between the sensor 2, 20 coupled to the terminals of the electronic computer 4. Specifically, a voltage-source sensor 2 (coupled to the terminals of the electronic computer 4) will deliver a voltage of the order of 5 V to the terminals of the electronic computer 4 whereas a current-source sensor 20 will deliver a voltage of less than 4.8 V thereto.

In the event that the result of the comparison is positive, that is to say that the voltage generated by the voltage-source sensor 2 is greater than 4.8 V, then the method makes provision for passing to a fourth step e4).

In the event that the result of the comparison is negative, that is to say that the current-source sensor 20 delivers a voltage of lower than 4.8 V, then the method makes provision for passing to a fifth step e5).

During the fourth step e4), the method makes provision for selecting an impedance matched to the coupling of the voltage-source sensor 2 to the terminals of the electronic computer 4. This impedance is, for example, equal to the value of the first resistor 110. During the fifth step e5), the method makes provision for selecting an impedance matched to the coupling of the current-source sensor 20 to the terminals of the electronic computer 4. This impedance is, for example, equal to the value of the second resistor 120. To do this, for example, the transistor 130 is in the closed-circuit position, that is to say it short-circuits the first resistor 110 thus applying an impedance of the order of the value of the second resistor 120 to the terminals of the electronic computer 4.

Thus, advantageously, by virtue of selecting the impedance value it is possible to connect either a voltage-source sensor or a current-source sensor to the terminals of the computer without modifying the hardware interface.

Advantageously, by virtue of an aspect of the invention, the type of sensor is detected instantaneously before, for example, the internal combustion engine is started.

Thus, by virtue of an aspect of the invention, it is now possible to couple either a voltage-source or current-source sensor to an engine control computer without prior calibration. Furthermore, ingeniously, no software calibration is necessary.

The invention claimed is:

1. A method for automatically detecting if a sensor coupled to an electronic computer, comprising:
   a first step e1) consisting in that the electronic computer is switched off,
   a second step e2), consisting of passing to a third step e3) when the electronic computer is activated,
   the third step e3), consisting of comparing a voltage generated by the sensor coupled to terminals of the electronic computer with a reference voltage, in the event that the result of the comparison is positive, determining that the sensor is a voltage sensor and then passing to a fourth step e4), and in the event that the result of the comparison is negative, determining that the sensor is a current sensor and then passing to a fifth step e5),
   the fourth step e4), consisting of selecting an impedance matched to the coupling of the voltage-source sensor to the terminals of the electronic computer, by activating a first transistor, a first pin thereof coupled to first a terminal of the terminals of the electronic computer, to short circuit a first resistor coupled to the first terminal of the terminals of the electronic computer and a second pin of the transistor, respectively, the fifth step e5), consisting of selecting an impedance matched to the coupling of the current-source sensor to the terminals of the electronic computer, by deactivating the first transistor.

2. The method for automatically detecting a sensor coupled to an electronic computer as claimed in claim 1, wherein the reference voltage has a value comprised between a value corresponding to a predetermined level of the voltage sensor and a value corresponding to a predetermined level of the current sensor.

3. The method for automatically detecting a sensor coupled to an electronic computer as claimed in claim 1, wherein the impedance matched to the coupling of the voltage-source sensor to the terminals of the electronic computer has a value of greater than 1000 Ω.

4. The method for automatically detecting a sensor coupled to an electronic computer as claimed in claim 1, wherein the impedance matched to the coupling of the current-source sensor (20) to the terminals of the electronic computer has a value of greater than 10 Ω.

5. The method for automatically detecting a sensor coupled to an electronic computer as claimed in claim 2, wherein the impedance matched to the coupling of the voltage-source sensor to the terminals of the electronic computer has a value of greater than 1000 Ω.

6. The method for automatically detecting a sensor coupled to an electronic computer as claimed in claim 2, wherein the impedance matched to the coupling of the current-source sensor to the terminals of the electronic computer has a value of greater than 10Ω.

* * * * *